United States Patent [19]

Frisina

[11] Patent Number: 5,629,555

[45] Date of Patent: May 13, 1997

[54] INTEGRATED STRUCTURE BIPOLAR TRANSISTORS WITH CONTROLLED STORAGE TIME

[75] Inventor: Ferruccio Frisina, S. Agata Li Battiati, Italy

[73] Assignee: Consorzio per la Ricerca sulla Microelettronica nel Mezzogiorno, Catania, Italy

[21] Appl. No.: 462,975

[22] Filed: Jun. 5, 1995

Related U.S. Application Data

[62] Division of Ser. No. 407,714, Mar. 21, 1995.

[30] Foreign Application Priority Data

Mar. 30, 1994 [EP] European Pat. Off. ............. 94830150

[51] Int. Cl.$^6$ ................... H01L 27/082; H01L 27/102; H01L 29/70; H01L 31/11; H01L 29/227
[52] U.S. Cl. ............................... 257/590; 257/610
[58] Field of Search ..................... 257/590, 610, 257/611, 49; 357/58

[56] References Cited

U.S. PATENT DOCUMENTS

| | | | |
|---|---|---|---|
| 3,423,647 | 1/1969 | Kurosawa et al. | 257/610 |
| 3,473,976 | 10/1969 | Castrucci et al. | 257/610 |
| 3,640,783 | 2/1972 | Bailey | 257/611 |
| 4,777,149 | 10/1988 | Tanabe et al. | 357/58 |
| 4,925,812 | 5/1990 | Gould | 437/142 |
| 5,227,315 | 7/1993 | Frisina et al. | 257/49 |

FOREIGN PATENT DOCUMENTS

| | | |
|---|---|---|
| 0420164 | 4/1991 | European Pat. Off. . |
| 0488440 | 6/1992 | European Pat. Off. . |
| 2128164 | 10/1972 | France . |

OTHER PUBLICATIONS

Journal of Applied Physics, Jul. 1, 1993, USA, vol. 74, nr. 1, pp. 195–200, ISSN 0021-8979, Coffa S. et al. "Three-Dimensional Concentration Profiles of Hybrid Diffusers In Crystalline Silicon".

Ion Implantation Technology. Ninth International Conference, Gainesville, FL, USA, 20–24 Sep. 1992, ISSN 0169-483X, Nuclear Instruments & Methods in Physics Research, Section B (Beam Interactions with Materials and Atoms), Apr. 1993, Netherlands, pp. 47–52, Coffa S. et al. "Diffusion and Lifetime Engineering Silicon".

*Primary Examiner*—Stuart S. Levy
*Assistant Examiner*—Adriana Giordana
*Attorney, Agent, or Firm*—Wolf, Greenfield & Sacks, P.C.; James H. Morris; Brett N. Dorny

[57] ABSTRACT

Integrated structure bipolar transistors with controlled storage time are manufactured by forming at least one bipolar transistor occupying a first area on a first surface of the silicon material, covering the first surface of the silicon material with an insulating material layer, and selectively removing the insulating material layer to open a window. The window has a second area much smaller than the first area occupied by the bipolar transistor. Therefore, by implanting into the silicon material a medium dose of platinum ions through the window and diffusing into the silicon material the implanted platinum ions, a uniform distribution of platinum inside the transistor is obtained.

6 Claims, 3 Drawing Sheets

Fig.3
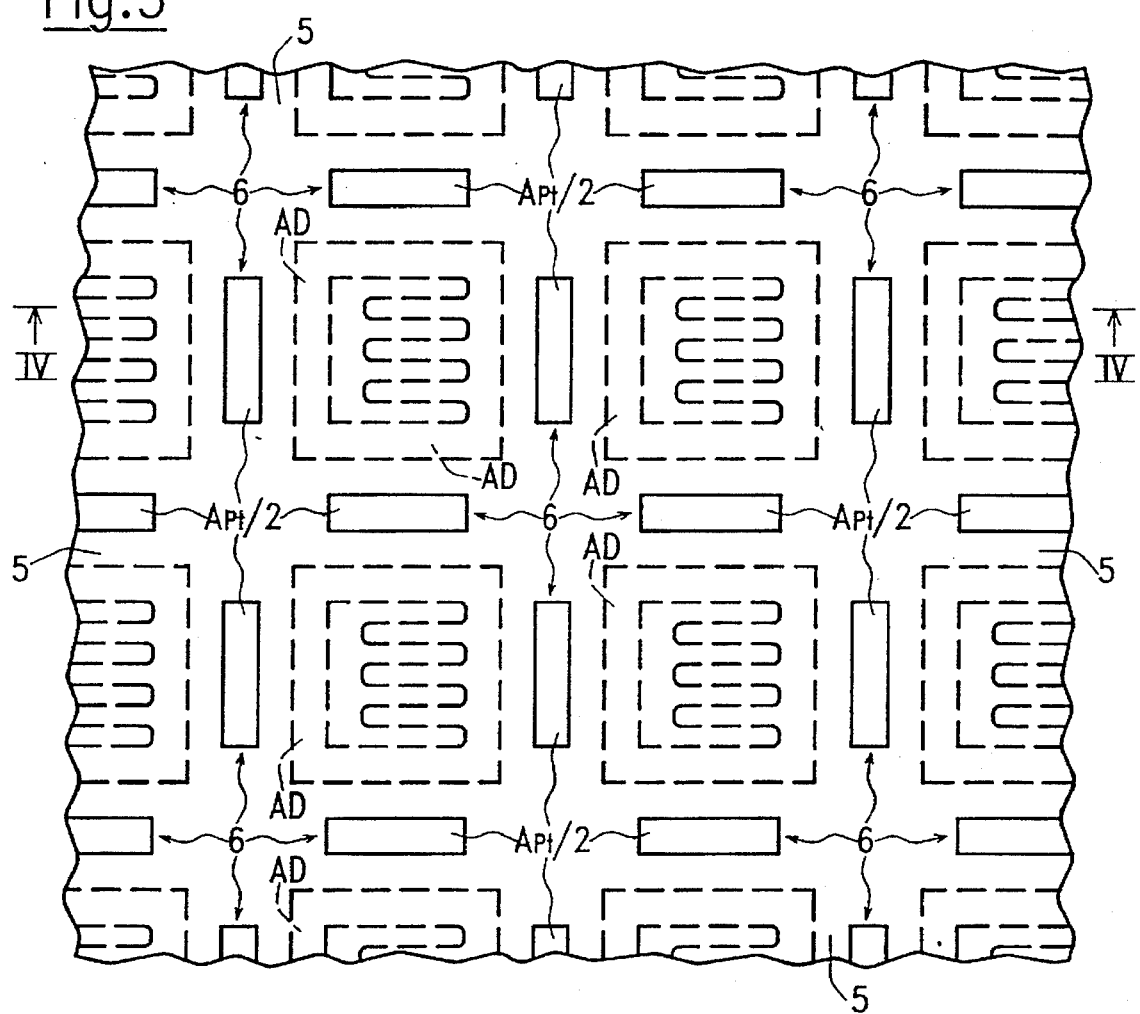
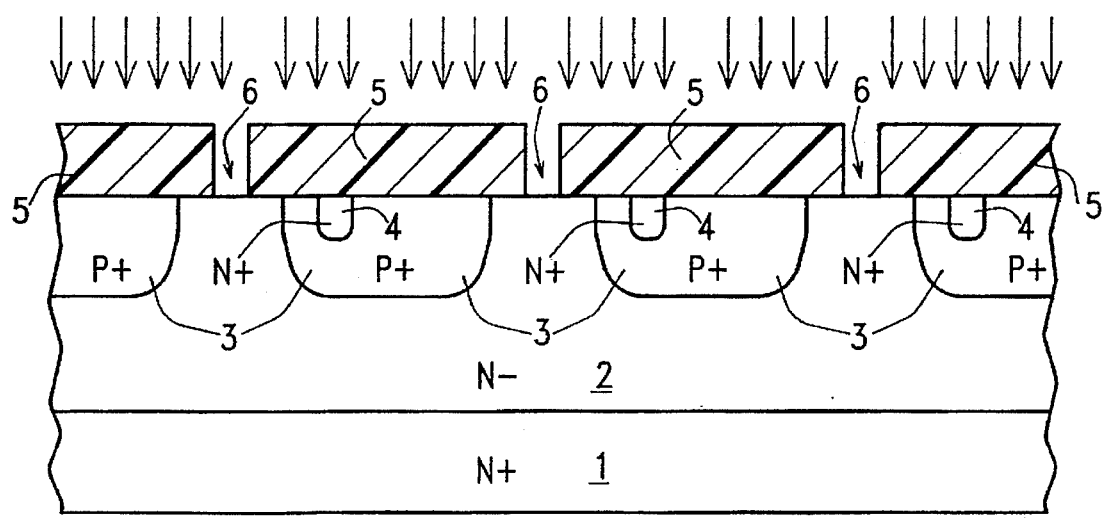
Fig.4

INTEGRATED STRUCTURE BIPOLAR TRANSISTORS WITH CONTROLLED STORAGE TIME

This application is a division of application Ser. No. 08/407,714, filed Mar. 21, 1995, entitled MANUFACTURING PROCESS FOR OBTAINING INTEGRATED STRUCTURE BIPOLAR TRANSISTORS WITH CONTROLLED STORAGE TIME, now pending.

BACKGROUND OF THE INVENTION

1. Field of the Invention

The present invention relates to integrated structure bipolar transistors with a controlled storage time, and a manufacturing process for obtaining such devices.

2. Discussion of the Related Art

In bipolar transistors, the "storage time" is a parameter defining the time necessary for the device to move from the saturation region to the active region, and depends on the biasing conditions and on the minority carrier lifetime in the base and collector regions of the transistor.

In several applications, such as lamp ballast circuits, it is advantageous to use power a bipolar transistors with a highly controlled storage time, in order to avoid adverse affects on the circuit oscillation frequency and the power delivered to the load. In view of such applications, the manufacturers make available different selections of transistors with guaranteed storage time values, with tolerances normally limited to 20% of the specified value.

One way to assure such a fine tuning of the storage time is to prevent the bipolar transistor from being driven into deep saturation, by means of circuital techniques such as those described in the European Patent Application No. 93830261.9.

Another way is to make use of techniques for controlling the minority carrier lifetime. In the practice, this means reducing the minority carrier lifetime from about 30 μs to 10-20 μs, depending on the specific application.

One known lifetime-control technique calls for exposing the device to electron radiation. In this technique, silicon atoms in the lattice are displaced from their sites, and deep energy levels are introduced in the silicon energy band gap. Such deep energy levels cause a variation of the minority carrier lifetime, which can therefore be controlled.

However, this technique has some limitations. First, electron-hole pairs are created at the interface between the silicon surface and the silicon dioxide layer, reducing the device reliability. Second, the damage produced in the lattice by the displacement of silicon atoms from their sites is unstable and varies with temperature and time. In fact, submitting the device to temperatures in the range of 280°–400° C. will re-establish in the lattice the conditions that existed before the exposure to the electron radiation, thereby destroying the controlled storage time. This is because during its packaging the device is submitted to a thermal process ("die attach") at temperatures ranging from approximately 300° C. to 350° C., and therefore the precision of the minority carrier lifetime tuning is compromised.

Another known lifetime-control technique calls for the introduction of platinum atoms. In this technique, the tuning of the minority carrier lifetime thus achieved is not affected even if the device is successively submitted to temperatures ranging from approximately 400° C. to 600° C.

The minority carrier lifetime τ is normally related to the dose of platinum atoms introduced into the silicon by the following equation:

$$(1/\tau) - (1/\tau_0) = K_{Pt} \times D$$

where $\tau_0$ is the minority carrier lifetime before the introduction of platinum atoms, $K_{Pt}$ is a constant for platinum, and D is the dose of platinum atoms introduced. It is therefore necessary to introduce extremely low doses of platinum atoms, ranging from $10^{10}$ to $10^{11}$ atoms/cm$^2$, since for doses of the order of $10^{12}$ atoms/cm$^2$ the minority carrier lifetime falls to values of some microseconds, which are too low for the applications under consideration. Such low doses cannot be statistically reproduced by any known implanting industrial apparatus. In fact, the dispersion between different implants could be higher than 50%, and would make the technique disadvantageous to be industrialized. The introduction of platinum atoms by means of the deposition technique is even more inadequate to achieve such low doses.

SUMMARY OF THE INVENTION

In view of the state of the art described, an object of the present invention is to provide a manufacturing process for obtaining bipolar transistors with controlled storage time by means of the introduction of platinum atoms into silicon, in a manner which overcomes the above-mentioned difficulties.

According to the present invention, this and other objects are attained by means of a manufacturing process for obtaining integrated structure bipolar transistors with controlled storage time including the steps of:

a) in a silicon material, forming at least one bipolar transistor occupying a first area on a first surface of the silicon material;

b) covering the first surface of the silicon material with an insulating material layer;

c) selectively removing the insulating material layer to open at least one window having a second area much smaller than the first area occupied by the bipolar transistor;

d) implanting into the silicon material a medium dose of platinum ions through said window;

e) diffusing into the silicon material the implanted platinum ions to obtain a uniform distribution of platinum inside the transistor.

As a result of embodiments of the present invention, it is possible to implant platinum ions with implant doses which are easy to control by using existing implanting apparatus. After thermal diffusion, the platinum ions are uniformly distributed in the device, and since the area of implantation is much smaller than the area of the device, the concentration of platinum is equivalent to that which will be obtained if the whole device surface would be implanted with a much lower dose of platinum ions, at a level which was impractical prior to this invention. The storage time of the device can thus be finely tuned.

BRIEF DESCRIPTION OF THE DRAWINGS

The features of the present invention will be made more evident by the following detailed description of several practical embodiments, illustrated as non-limiting examples in the annexed drawings:

FIG. 3 is a top plan view of said portion of wafer, taken at another intermediate step of the manufacturing process.

FIG. 4 is a cross-sectional view of the portion of wafer taken along the line IV—IV of FIG. 3.

DETAILED DESCRIPTION

Figure 2:
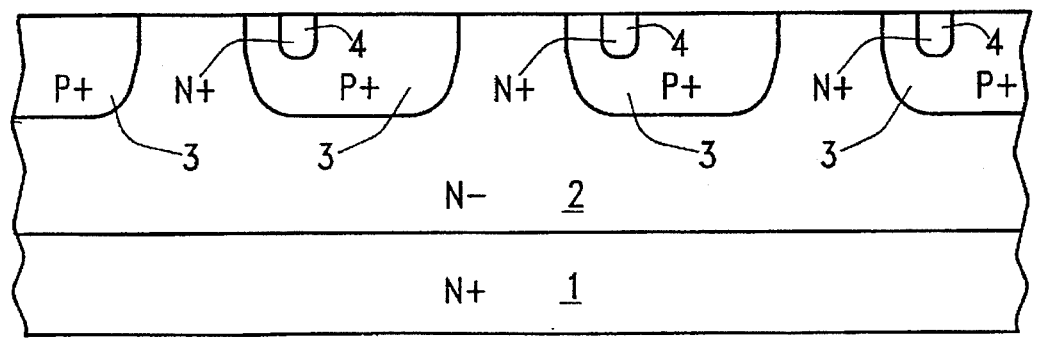
FIG. 2 is a cross-sectional view of the portion of wafer taken along the line II—II of FIG. 1.

A manufacturing process according to an embodiment of the invention starts with a silicon wafer heavily doped to form an N+ substrate 1, as shown in FIG. 2.

Over the substrate 1 a lightly doped N− layer 2 is grown, for example epitaxially, with resistivity and thickness determined on the basis of the breakdown voltage desired for the bipolar transistors which are to be fabricated. The N− layer 2, also shown in FIG. 2, constitutes a collector region of the bipolar transistors.

Figure 1:
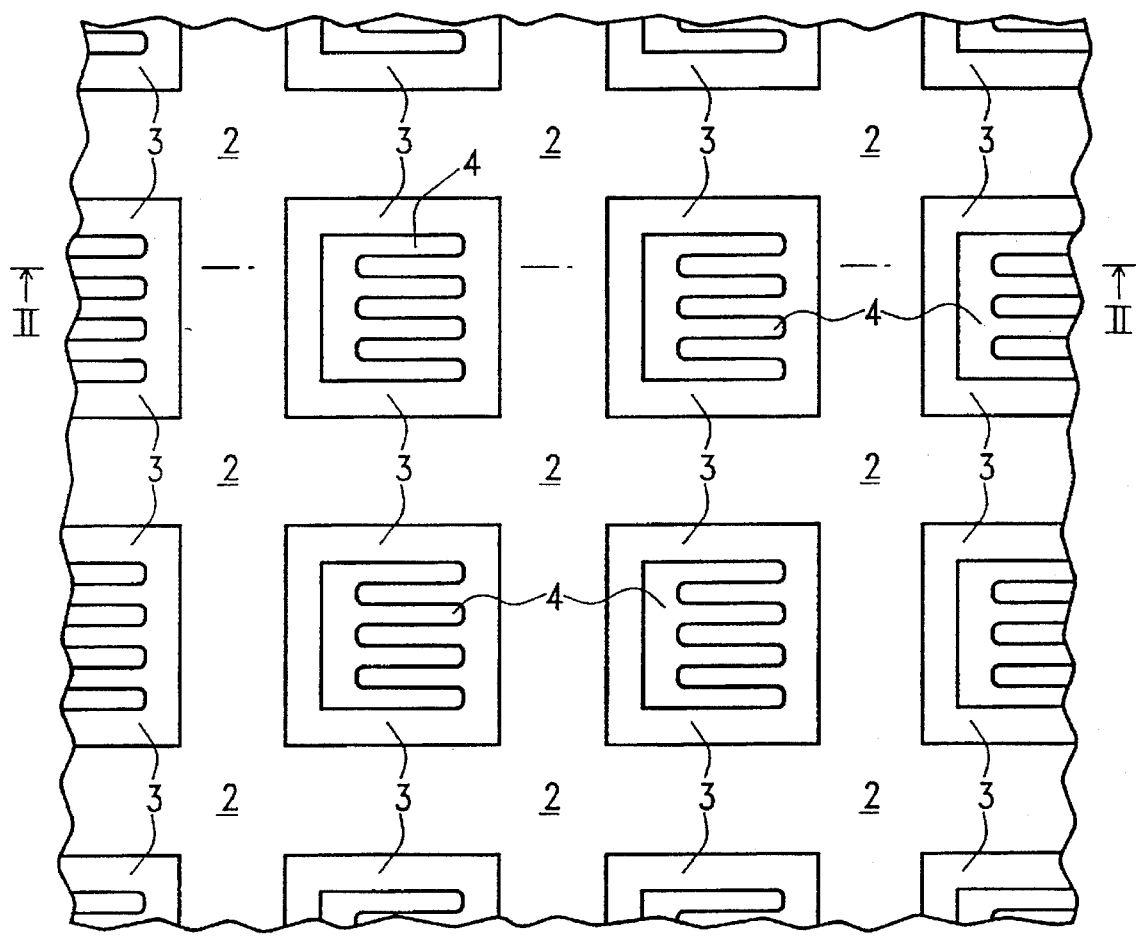
FIG. 1 is a top plan view of a portion of a semiconductor wafer, taken at an intermediate step of a manufacturing process according to an embodiment of the present invention.

Acceptor-type dopant impurities are then selectively introduced, according to any known technique, into the N− layer 2 (for example by means of ion implantation and diffusion), to form heavily doped P+ regions 3, substantially with square shape, each constituting a base region of a respective bipolar transistor. As shown in FIG. 1, the P+ regions 3 are normally disposed to form a bidimensional array on the wafer surface.

Donor-type dopant impurities are then selectively introduced into the P+ regions 3 to form N+ regions 4, each one constituting an emitter region of said respective bipolar transistor. As shown in FIG. 1, the N+ regions 4 can for example have a comb-like shape, to increase emitter efficiency.

The wafer is then oxidized, and an oxide layer 5 thus formed is selectively removed from the surface of the wafer to open windows 6 to expose selected areas of the wafer surface. As shown in FIG. 3, the windows 6 may be located along the sides of the P+ regions 3. In one arrangement, each P+ region 3 is surrounded by four windows 6.

Platinum ions are then selectively implanted into the wafer surface with an implantation dose D (atoms/cm$^2$), with the oxide layer 5 acting as a mask. Platinum ions can therefore be introduced into the N− layer 2 only in correspondence of the windows 6. The platinum ions thus introduced are then made to diffuse, for example, by heating the wafer to a temperature ranging from 850° C. to 1000° C. At the end of this step the platinum ions are uniformly distributed in the bulk of the silicon wafer.

Each window 6 has an area $A_{Pt}/2$. Since the platinum ions introduced through each window 6 diffuse isotropically into the silicon, they are shared by two adjacent devices. Each window 6 contributes therefore for an area $A_{Pt}/4$ to the area of implantation of platinum ions per device. Since each device is surrounded by four windows 6, the area of implantation of platinum ions per device is globally $A_{Pt}$. Assuming that the area occupied on the wafer surface by each device is $A_D$, substantially corresponding to the area of the P+ base region 3, after the diffusion the concentration of platinum in each device corresponds to that which will be obtained if an equivalent dose Deq of platinum ions would be implanted into the whole area $A^D$ of the device, with Deq being given by:

$$Deq=D \times A_{Pt}/A_D.$$

By making the window areas $A_{Pt}/2$ very small, so that $A_{Pt}$ is much lower than $A_D$, it is possible to obtain a value for the equivalent dose Deq of implanted platinum ions which is very low, even if the effective implant dose D is kept in a range of values sufficiently high to allow the use of the existing implanting apparatus, and to be reproducible. If for example the device area is $A_D=10$ mm$^2$ and $A_{Pt}=0.01$ mm$^2$, the factor $A_{Pt}/A_D$ is $1/1000$, and for an implantation dose D=$10^{13}$ at/cm$^2$ there is obtained an equivalent implantation dose Deq=$10^{10}$ at/cm$^2$. Decreasing the window area, or keeping the same window area for larger devices, lower equivalent implantation doses of platinum can be obtained. In this way it is possible to introduce into the silicon wafer a controlled amount of platinum ions which is reproducible, and which therefore yields bipolar transistors with a controlled storage time, with a minority carrier lifetime in an exemplary desired range of 10 to 20 µs.

The diffusion step of the implanted platinum ions is carried out after all the other thermal steps in the manufacturing process have been performed. It has been experimentally verified that with a temperature of approximately 850°–1000° C., a few hours are sufficient to obtain a uniform distribution of the platinum ions over the whole wafer. Since the diffusion steps utilized for the manufacturing of power devices call for high temperature processes of approximately 1100°–1200° C. and long times (approximately 5–15 hours), the diffusion process of the platinum ions do not alter the junction depths of the layers.

Figure 5:
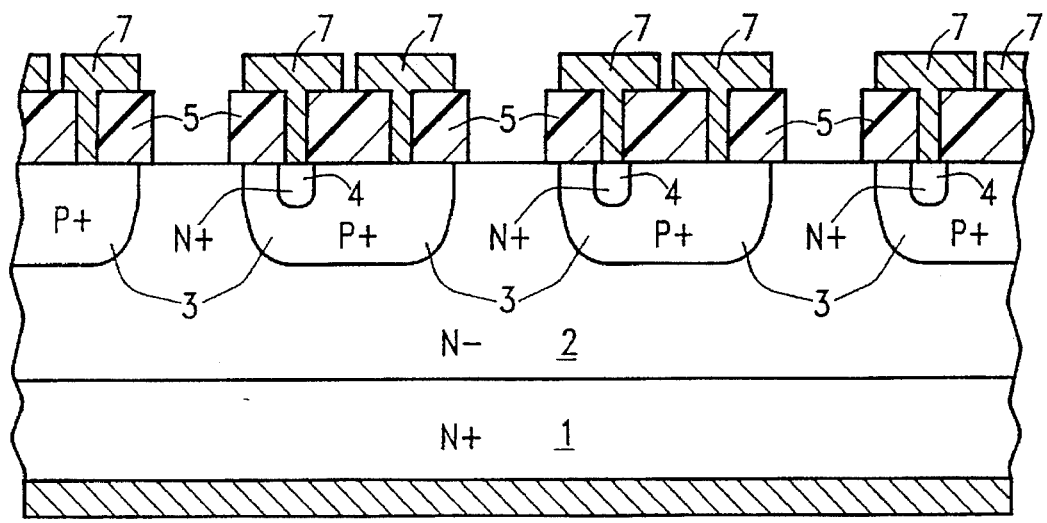
FIG. 5 is a cross-sectional view similar to FIG. 4, taken at a third intermediate step of the manufacturing process.

After the introduction of platinum, the oxide layer 5 may be selectively removed to form contact holes, and a metal layer 7 may be deposited over the wafer surface and selectively etched to provide electrical contacts to the P+ base regions 3 and to the N+ emitter regions 4 of the various devices, as show in FIG. 5. The oxide layer 5 may also be removed along the sides of the devices to facilitate the device cutting by means of mechanical or laser scribing.

Figure 6:
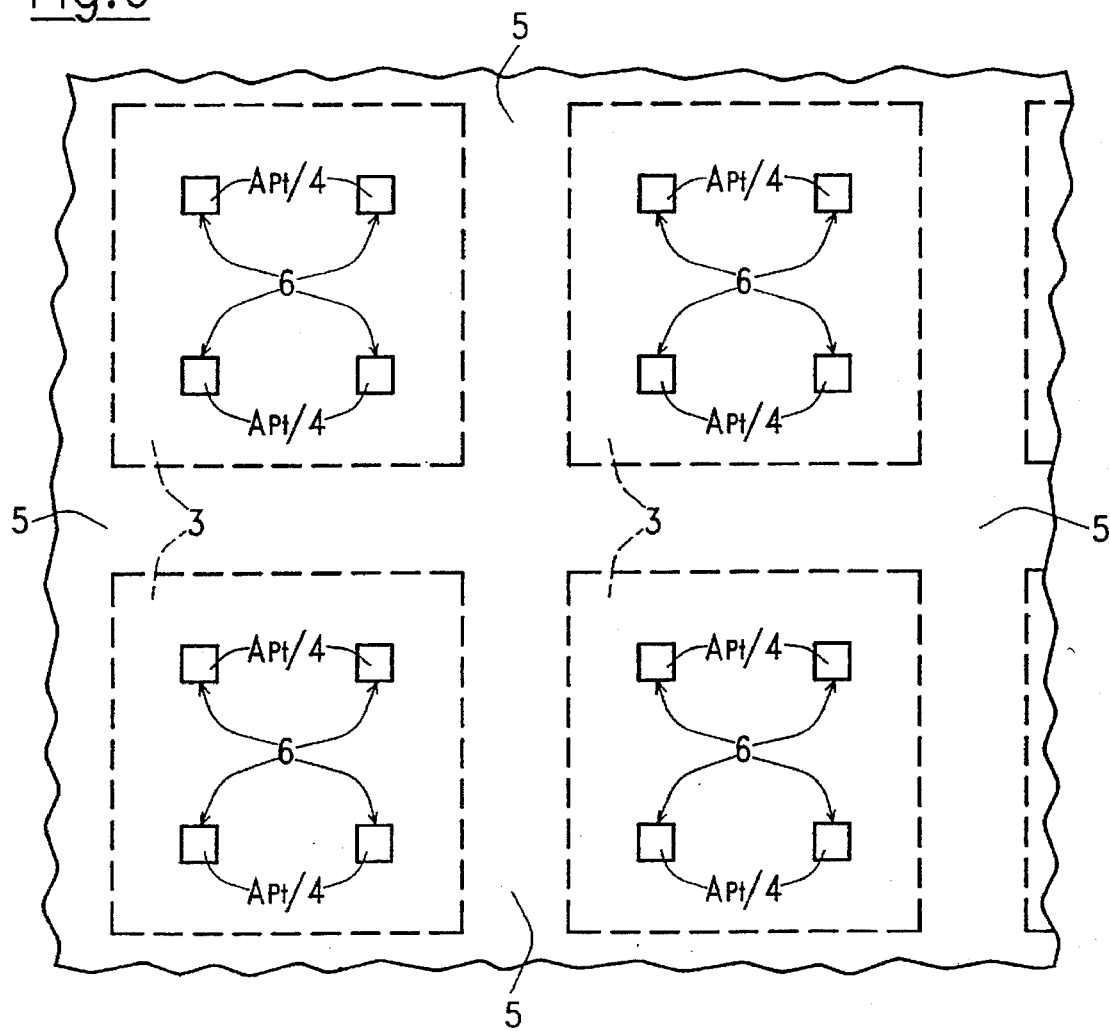
FIG. 6 is a top plan view similar to that of FIG. 3, taken at an intermediate step of a manufacturing process according to another embodiment of the present invention.

According to a second embodiment of the present invention, shown in FIG. 6, if the device area $A_D$ is of the order of 1 cm$^2$ the windows 6 in the oxide layer 5 can be opened over the devices, instead that along their sides. This makes it possible to obtain, after implantation and diffusion, a uniform distribution of platinum ions in the silicon wafer, without increasing the temperature and/or the time duration of the platinum diffusion steps. The distribution of windows 6 over each device can be varied, the only requirement being that the overall area $A_{Pt}$ of the device exposed to the implantation of platinum ions is much smaller than the device area $A_D$. In the shown example, four windows 6 per device have been opened, each window 6 having an area $A_{Pt}/4$.

Even if the process according to the invention has been described with reference to the fabrication of controlled storage time NPN bipolar transistors, it is evident to anyone skilled in the art that it can as well be used for the fabrication of controlled storage time PNP transistors, by exchanging the P-type semiconductor regions with N-type, and exchanging the N-type regions with P-type.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor wafer to be subjected to a dose of ions, the dose being diffused throughout a portion of the semiconductor wafer, the semiconductor wafer comprising:

a) a transistor that occupies a first portion of the semiconductor wafer, the first portion defining a first area of a first surface of the semiconductor wafer; and b) a layer of protective material on the first surface of the semiconductor wafer, the layer including at least one window that exposes only a second area of the first surface of the semiconductor wafer to receive the dose of ions, a ratio between the second area and the first area being approximately $1/1000$.

2. The semiconductor wafer of claim 1, wherein the ions are platinum ions.

3. The semiconductor wafer of claim 2, wherein the transistor is one of a manufacturing batch of transistors formed in the semiconductor wafer, each transistor of the manufacturing batch of transistors having a substantially similar storage time.

4. The semiconductor wafer of claim 1, wherein the at least one window is disposed directly over the first area.

5. The semiconductor wafer of claim 1, wherein the at least one window is disposed adjacent to but not directly over the first area.

6. The semiconductor wafer of claim 1, wherein the transistor includes a bipolar power transistor having a controlled storage time.

* * * * *